United States Patent
Chakraborty

(10) Patent No.: US 9,712,143 B2
(45) Date of Patent: Jul. 18, 2017

(54) SYSTEM AND METHOD FOR A REDUCED HARMONIC CONTENT TRANSMITTER FOR WIRELESS COMMUNICATION

(71) Applicant: TEXAS INSTRUMENTS INCORPORATED, Dallas, TX (US)

(72) Inventor: Sudipto Chakraborty, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 5 days.

(21) Appl. No.: 14/971,655

(22) Filed: Dec. 16, 2015

(65) Prior Publication Data

US 2017/0179936 A1    Jun. 22, 2017

(51) Int. Cl.
  H03H 11/16    (2006.01)
  H03K 5/131    (2014.01)
  H03M 1/66    (2006.01)
  H03K 5/00    (2006.01)

(52) U.S. Cl.
  CPC ............. *H03K 5/131* (2013.01); *H03M 1/66* (2013.01); *H03K 2005/00058* (2013.01); *H03K 2005/00286* (2013.01)

(58) Field of Classification Search
  None
  See application file for complete search history.

(56) References Cited

U.S. PATENT DOCUMENTS

| | | | | |
|---|---|---|---|---|
| 6,247,138 B1* | 6/2001 | Tamura | ............... | G11C 7/1072 713/400 |
| 6,650,689 B1* | 11/2003 | Oishi | ................... | H04B 1/7075 375/142 |
| 2009/0082006 A1* | 3/2009 | Pozsgay | ................ | H03M 3/504 455/422.1 |
| 2010/0219998 A1* | 9/2010 | Oliaei | ..................... | H03M 3/37 341/143 |
| 2014/0267925 A1* | 9/2014 | Koroglu | ............... | H04N 5/4401 348/726 |
| 2015/0295583 A1* | 10/2015 | Tang | ....................... | H03L 7/099 331/48 |

* cited by examiner

*Primary Examiner* — Cassandra Cox
(74) *Attorney, Agent, or Firm* — John R. Pessetto; Charles A. Brill; Frank D. Cimino

(57) ABSTRACT

A system includes a voltage-controlled oscillator (VCO) to generate an output signal based on an input voltage and a multi-stage delay network to receive the output signal from the VCO. Each stage of the delay network produces a phase-shifted output signal. The system includes a multi-stage digital-to-analog converter (DAC) network, where each stage of the DAC network is associated with a corresponding stage of the delay network. Each stage of the DAC network receives the phase-shifted output signal from its corresponding stage of the delay network and generates a weighted output signal based on the received phase-shifted output signal. The DAC network combines the weighted output signal of each stage. A weighting factor for each stage of the DAC network is selected to reduce harmonic content of the combination of weighted output signals.

19 Claims, 3 Drawing Sheets

SYSTEM AND METHOD FOR A REDUCED HARMONIC CONTENT TRANSMITTER FOR WIRELESS COMMUNICATION

BACKGROUND

Wireless transceiver systems are used in a variety of consumer electronics, medical devices, automotive electronics, industrial applications and other applications where reduced form factor and reduced cost are driving motivations. Of course, regardless of the application, a high signal-to-noise (SNR) ratio is desired, which requires a high fundamental signal to harmonic ratio.

To communicate over long distances, a high-output power amplifier is required. In certain applications, a transceiver will not meet Federal Communications Commission (FCC) requirements (e.g., spectral mask requirements) if there is too much harmonic content in the output wave form. Conventionally, in order to achieve sufficient harmonic reduction, significant filtering is applied using either on-chip or off-chip components, which require calibration and trimming, and consume area and power. In particular, in high-volume applications, such external filtering components are highly undesirable due to their contribution to cost and power consumption.

BRIEF DESCRIPTION OF THE DRAWINGS

For a detailed description of various examples, reference will now be made to the accompanying drawings in which.

DETAILED DESCRIPTION

Figure 1:
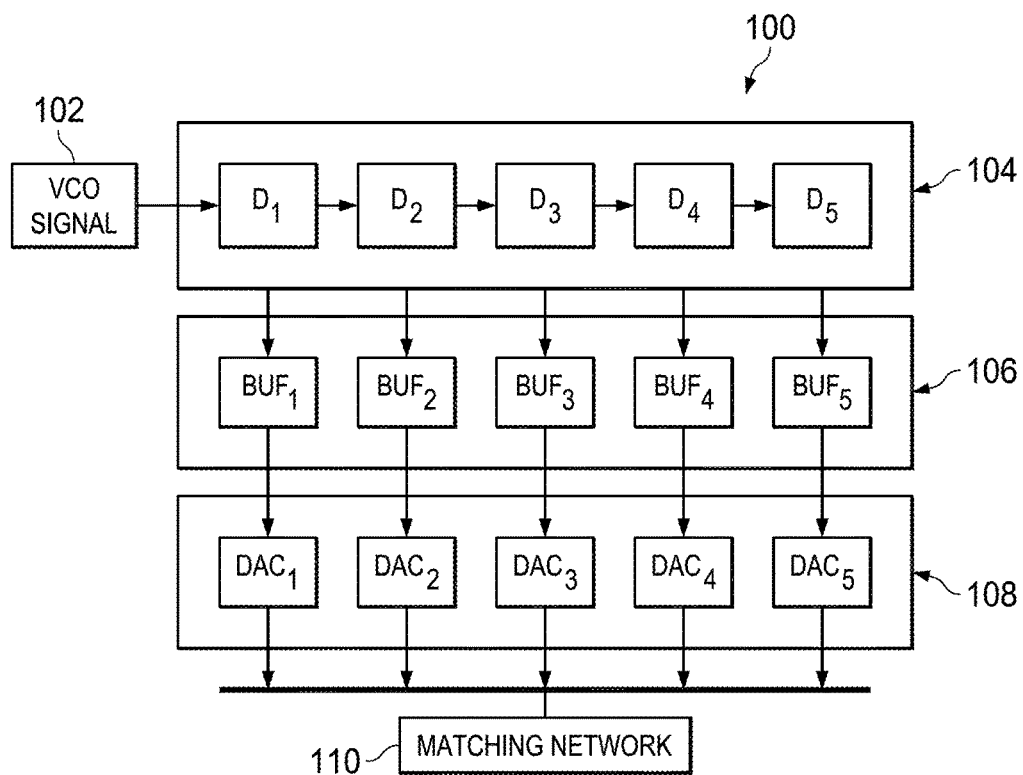
FIG. 1 shows a block diagram of a system to generate an amplified output signal, such as a transmitter for wireless transmission, in accordance with various examples.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

A power amplifier for wireless communication is typically driven with a very large signal at the input power and, in order to achieve a high output power, is supplied with a large supply voltage (e.g., 3V or greater). Driving a power amplifier hard, or as non-linearly as possible provides high power-added efficiency, introduces a large number of harmonics to the output of the power amplifier. As explained above, FCC spectral mask requirements dictate a certain maximum level of harmonic content that is allowable, above which a device will not receive FCC certification. Conventionally, a large number of external, post-power amplifier filtering elements including passive reactive components were required to reduce the harmonic content of the output signal to acceptable levels. However, these external filtering elements introduce unwanted cost, signal attenuation, and power consumption to a wireless transceiver, leading to a loss of overall dynamic range, which is undesirable, particularly in high volume applications.

Various examples of the present disclosure are directed to systems and methods for reducing harmonic content for wireless communication. In particular, a high efficiency, multi-band wireless transceiver provides an output signal for wireless transmission having reduced harmonic content while avoiding the need for external filtering networks, and thus retaining efficiency of its power amplifier. In particular, a voltage-controlled oscillator (VCO) signal is provided to a multi-stage delay network, which includes multiple delay elements (or stages), such as inverters. Each of the delay elements outputs a phase-shifted VCO signal relative to the VCO signal received by the particular delay element. It will be appreciated that the delay network has the effect of a frequency divider, and thus in an embodiment in which the delay network contains M delay elements, the VCO is operated at M times the fundamental frequency for the wireless transceiver.

A digital-to-analog conversion (DAC) network operates as the power amplifier for the wireless transceiver and includes a number of DAC element stages that corresponds to the number of stages of the delay network. Each stage of the DAC network applies a variable weighting factor to the received phase-shifted VCO signal, for example by tailoring the drive strength of each DAC stage to apply that stage's determined weighting factor. The DAC network then sums or combines the weighted output signals of the DAC stages and provides the combined output signal to a matching network for subsequent wireless transmission.

The selection of the weighting or scaling factors is dependent on the particular stage, and will be explained in further detail below. However, the weighting factors are selected such that harmonics are cancelled at the output of the DAC stages when combined. Importantly, the harmonic combination occurs at the output, which leaves no further introduction of nonlinearities in the signal chain caused by active circuits. The combination of weighted output signals from the DAC stages results in an output signal with a near-sinusoidal waveform shape which is then transmitted wirelessly. It should be appreciated that "near-sinusoidal" as used herein refers to a waveform that generally follows a sinusoidal form, but does not necessarily have a perfect sinusoidal shape, which is of course difficult to achieve in practice.

A near-sinusoidal waveform has the benefit of reduced harmonic content relative to, for example, a square wave. As a result of the reduced harmonic content, such an output signal is more suitable for applications in which FCC requirements (e.g., spectral mask requirements) must be satisfied. Further, and as will be explained below, examples of the present disclosure avoid the need for on-chip or off-chip filtering, which is costly from a power and area perspective. Certain examples may optionally include a harmonic trap (e.g., placed on-chip) to reject higher-order harmonics that are not cancelled by the application of scaling to the DAC stages and their subsequent combination to be output.

FIG. 1 shows a system 100 to generate an amplified output signal for wireless transmission in accordance with various examples of the present disclosure. That is, the system 100 may be part of a wireless transmitter chain, where the output of the system 100 is provided to an antenna for wireless transmission, for example. The system 100 includes a VCO 102 that generates a VCO signal. The VCO 102 may comprise any number of suitable topologies, including a ring oscillator. The VCO 102 generates a square shaped waveform that swings from rail to rail (e.g., from ground to a supply voltage). Although shown as a single-ended structure for simplicity, examples of the present disclosure may be extended to fully-differential structure as well.

The VCO 102 provides the oscillator signal to a delay network 104, which is shown as including five delay stages, notated D1-D5. It should be appreciated that the delay stages may use different circuit design styles, and one example may include simple, inverter-based circuits. One effect of the delay network 104 is to divide the frequency of the VCO 102 signal by the number of stages in the network 104, which is five in the example shown. Thus, in certain examples of the present disclosure, the VCO 102 is operated at five (or M, more generally) times the fundamental frequency for the wireless transmitter system 100. Further, the output of each delay stage is phase-shifted relative to that delay stage's input, resulting in five different phase-shifted versions of the VCO 102 signal being output by the delay network 104. In particular, the output phasors of the delay 104 stages will be $2\pi/M$ apart with respect to similar edges (i.e., rising or falling), where M is the number of stages in the delay network 104.

The system 100 also includes a buffer network 106 that includes a number of stages (notated BUF1-BUF5) that corresponds to the number of stages in the delay network 104. Each buffer 106 stage receives an output from one of the delay 104 stages, which as explained above are phase-shifted versions of the VCO 102 signal. The buffer network 106 may not be required in all examples of the present disclosure; however, where utilized, the buffer network 106 serves to isolate a DAC network 108 from the delay network 104.

The DAC network 108, similar to the delay and buffer networks 104, 106, also includes a number of stages (notated DAC1-DAC5) that corresponds to the number of stages in the delay and buffer networks 104, 106. Each DAC 108 stage applies a weighting factor to scale the phase-shifted VCO 102 signal that is received from the delay network 104 or the buffer network 106. The weighting factors are selected such that, when applied to the phase-shifted outputs generated by the delay network 104 and combined or summed, generate a near-sinusoidal waveform. The output of the DAC network 108 may be changed by changing a supply voltage of the DAC stages. For example, the voltage supply may be derived from a DC-DC converter, which results in a lower current consumption from a high-voltage battery.

In particular, the variable weighting factor may be applied by each DAC 108 stage to its phase-shifted input by tailoring the drive strength of each DAC 108 stage relative to the other DAC 108 stages. In accordance with certain examples of the present disclosure, the variable weighting factor ($a_n$) is determined by:

$$a_n = \cos(n\pi/m) - \cos((n+1)\pi/m) \quad \text{(Equation 1)},$$

where n is the number of the delay stage (e.g., 0 through 4) and m is the number of stages (e.g., 5). The weighting factor for a particular phase-shifted VCO 102 signal is applied by the amplification of the DAC 108 stage, and the resulting weighted outputs are combined by the DAC network 108 (e.g., by summing currents or voltages), where the combined output signal is passed to a matching network 110 for subsequent wireless transmission.

Of course, it should be appreciated that Equation 1 need not necessarily be determinative of the weights applied by the DAC 108 stages, and the scope of the present disclosure is not so limited. In fact, other weighting schemes may be utilized, in particular those in which the resultant combined or summed output is near-sinusoidal in nature, which has the benefit of reducing harmonic components from the signal while avoiding the need for on-chip or off-chip filtering, thus saving both power and area. Further, although the delay, buffer, and DAC networks 104, 106, 108 are shown as having an odd number of stages, this is exemplary. In fact, certain embodiments containing an even number of stages are similarly within the scope of the present disclosure.

Figure 2:
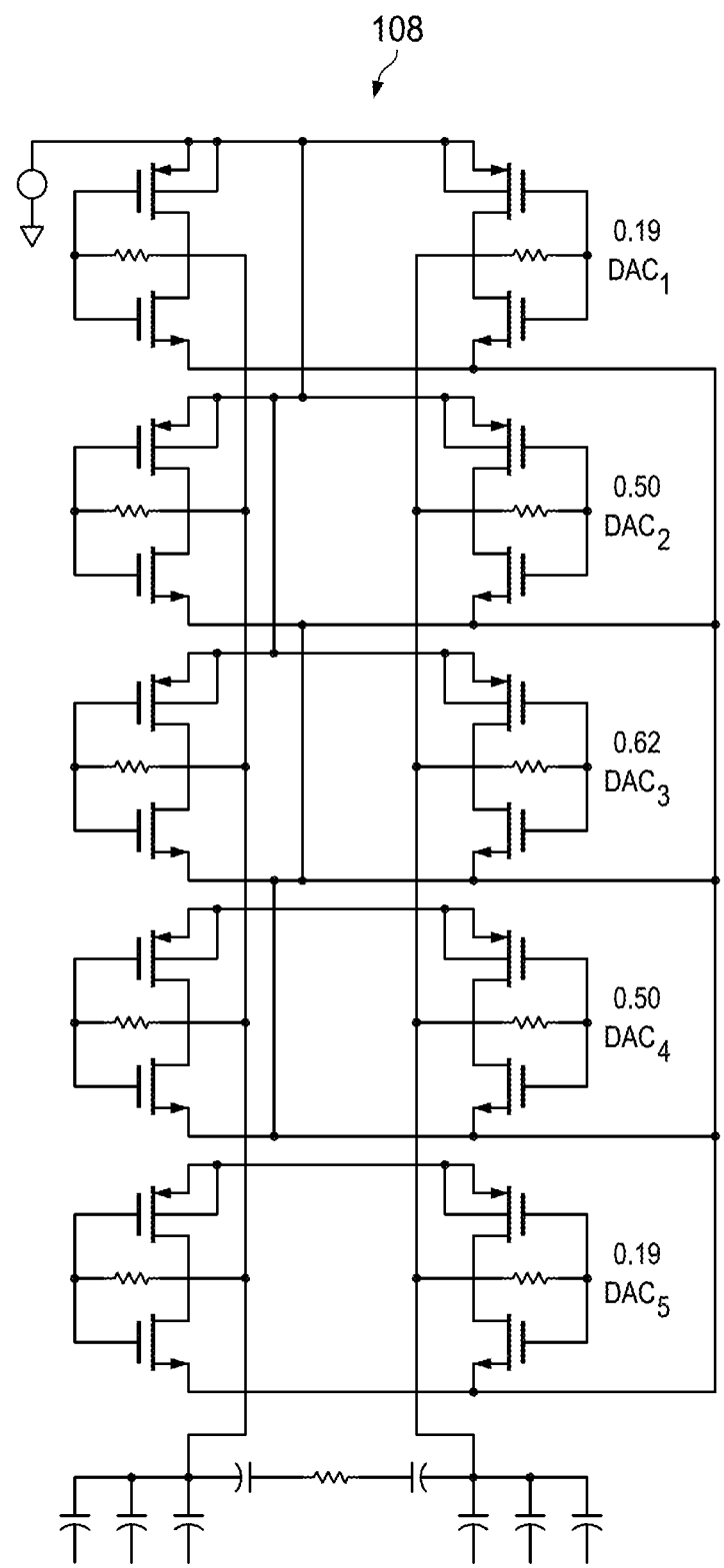
FIG. 2 shows an exemplary circuit schematic of a multi-stage digital-to-analog converter network, such as an output stage of the transmitter of FIG. 1, in accordance with various examples.

The matching network 110 typically consists of passive reactive components (e.g., inductors and capacitors) that provide a high quality factor. The passive reactive components provide low loss impedance transformation between the input and output of the matching network 110 to obtain maximum power to be delivered to the antenna while maintaining a desired voltage standing wave ratio, and to maintain certain output impedance matching. Individual reactive components typically provide high quality factor to minimize signal loss. However, the overall quality factor of the system 100 and matching network 110 is also dependent on the antenna load impedance. For example, in typical wireless communication, the loaded quality factor is greater than unity (e.g., on the order of 10-20), which leads to additional filtering of harmonic contents of the desired signal. However, in an automotive application (e.g., a wireless key fob), a low quality factor antenna (e.g., closer to 1) is preferred because it provides less variation in radiation pattern in cases where the user touches the key fob versus those in which the user is not touching the key fob. Due to this low quality factor antenna, all harmonic components are desired to be rejected by some signal processing on-chip in a robust manner FIG. 2 shows an exemplary circuit implementation of the DAC network 108 in accordance with examples of the present disclosure. As will be noted, each DAC 108 stage DAC1-DAC5 uses similar circuit topology. However, the DAC stages DAC1-DAC5 apply different weighting factors, or are scaled relative to each other as indicated by the scaling factors and 0.19, 0.50, 0.62, which will be explained in further detail below. The delay network 104, acting as a frequency divider, directly drives the DAC stages DAC1-DAC5, and may employ a dummy-terminated load to provide phasor symmetry at the output of the delay or divider stages 104. For example, for the power amplifier DAC stages to provide a near-sinusoidal output, the weighting factor of each stage differs according to the phase of that stage. However, at high frequencies, these differences in weighting, when reflected back to the output of the delay or divider stages 104 by finite reverse isolation may create phase imbalance, leading to higher-than-expected harmonic levels at the output of the power amplifier.

Thus, it may be advantageous that all phases at the delay or divider stage 104 output experience the same loading.

Examples of the present disclosure may achieve this more uniform loading by providing a dummy load at the output of the buffer stage 106. For example, in the case where the weighting factors for the five DAC stages are 0.19, 0.5, 0.62, 0.5, and 0.19, respectively, the buffer stage 106 always drives 0.62 units of load (i.e., corresponding to the maximum weighting value), where dummy load values are 0.43, 0.12, 0.0, 0.12, and 0.43, respectively, so that the sum of load values for all phases is 0.62. This provides equal loading of all phases from the divider stage 104 to the buffer stage 106, which results in improved harmonic suppression. Of course, certain examples of the present disclosure may scale weighting values by a static scaling factor to ease the realization in particular circuit designs. The self-biased DAC stages DAC1-DAC5 then generate output currents proportional to their respective scaling factors, which are then summed to combine the various phase-shifted and weighted signals at the output of the DAC network 108.

Figure 3:
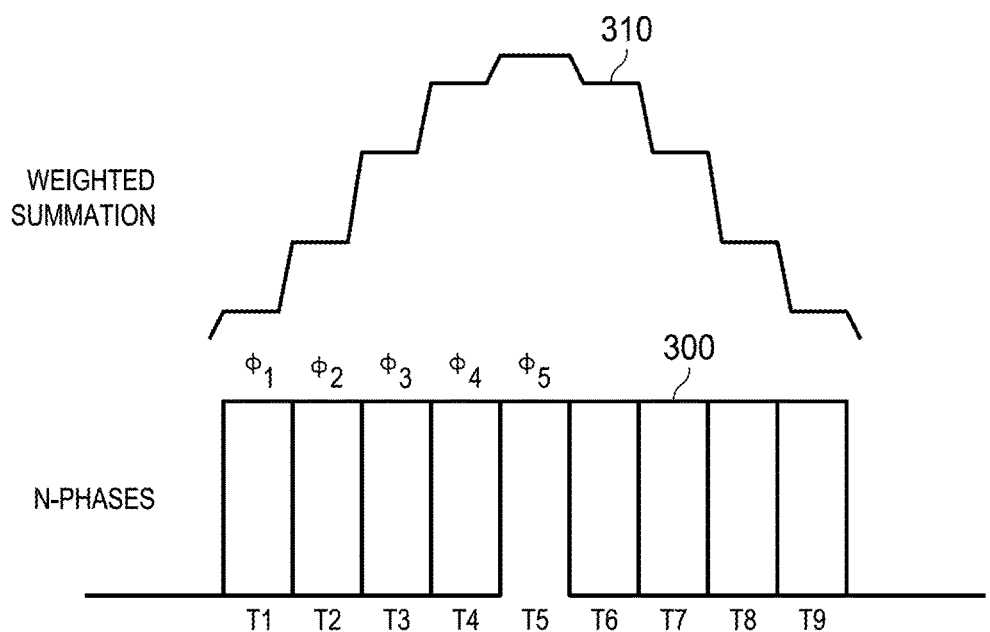
FIG. 3 shows an example of weighted, phase-shifted oscillator outputs and their resulting summation or combination, for example to produce a low harmonic content output waveform of the transmitter of FIG. 1, in accordance with various examples.

Referring briefly to FIG. 3, an example 300 is shown in which five phase-shifted outputs are generated, notated by $\phi 1$-$\phi 5$. Using Equation 1 given above, the values for the DAC stage weighting factors are given by approximately 0.19, 0.5, 0.62, 0.5, and 0.19, respectively. Thus, the weighted summation in time period T1 is given by 0.19($\phi 1$), the weighted summation in time period T2 is given by 0.19($\phi 1$)+0.5($\phi 2$), the weighted summation in time period T3 is given by 0.19($\phi 1$)+0.5($\phi 2$)+0.62($\phi 3$), the weighted summation in time period T4 is given by 0.19($\phi 1$)+0.5($\phi 2$)+0.62($\phi 3$)+0.5($\phi 4$), and the weighted summation in time period T5 is given by 0.19($\phi 1$)+0.5($\phi 2$)+0.62($\phi 3$)+0.5($\phi 4$)+0.19($\phi 1$). In subsequent time periods (i.e., T6-T9), contributions from the output phasors to the weighted sum are removed as those phasors oscillate to a low voltage (e.g., ground), starting with 0.19($\phi 1$) and ending with 0.19($\phi 5$). It should be appreciated that while the sequence of weights is important, the absolute phase is less so. That is, in this example, the weight sequence of {0.19, 0.5, 0.62, 0.5, 0.19} should be applied to output phasors in sequence, but the starting phase may be any one of the output phasors among the five. The starting phase merely alters the effective delay through the power amplifier network and does not impact the output power, modulation, or harmonic contents.

As can be seen in view of FIGS. 1-3, by intelligently applying weighting factors to phase-shifted VCO 102 signals, the output signal 310 takes on a near-sinusoidal shape, which greatly reduces the harmonic content. This reduction in harmonic content does not rely on external filtering, which reduces external components, leading to a lower implementation cost and reduction in power consumption. Generally, in a transmitter, the VCO generates high-frequency signals and is locked using a phase-locked loop (PLL) referenced with respect to a crystal oscillator to guarantee operation at a desired frequency over process and temperature variations, limited only by crystal tolerance which is small. Granularity of the phasors is determined by the number of delay stages connected in the ring, and is held at a precise value. The output frequency is a direct division of input frequency and thus, as long as the VCO is locked by the PLL, it is held at a fixed value regardless of process and temperature variations. Further, as will be appreciated, increasing the number of stages in the delay network 104 and the DAC network 108 generally results in further harmonic reduction, although with some associated increase in power consumption. Thus, depending on the particular application and harmonic reduction requirements, it may be advantageous to utilize only enough stages in the delay network 104 and the DAC network 108 to achieve the required harmonic reduction, so as to minimize power consumption and design area.

As shown in FIG. 1, the VCO 102 generates an oscillator signal that is provided to the delay network 104, which both serves to divide the frequency of the VCO 102 as well as generate multiple phase-shifted signals. However, it should be appreciated that in some cases, such as where the VCO 102 comprises a ring oscillator, the delay network 104 may itself be a part of the ring oscillator. For example, by tapping each of the multiple stages in a ring oscillator, phase-shifted and frequency-divided outputs are attainable, which can then be fed to the DAC 108 stages for scaling and subsequent combination. All such variations are within the scope of the present disclosure.

Figure 4A:
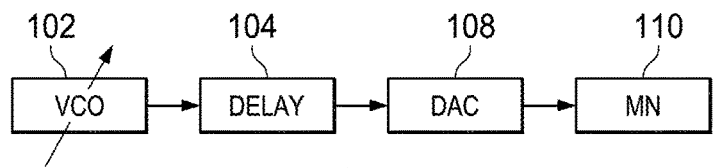
FIGS. 4a-4c show block diagrams of different implementations for multi-band transmission.
Figure 4B:
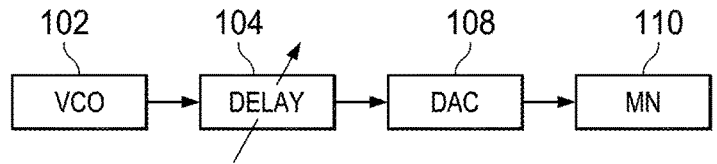
Figure 4C:
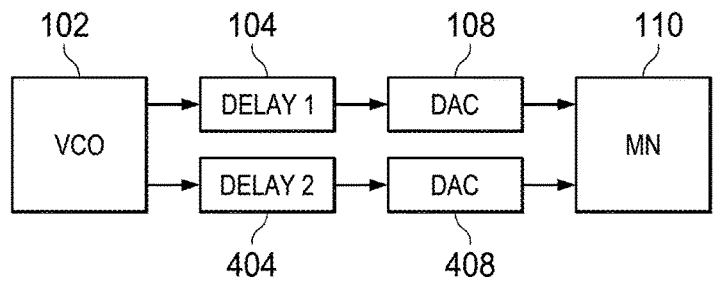

Turning now to FIGS. 4a-4c, various exemplary multiband implementations are shown, which allow the above system 100 to reduce harmonic content without employing external filtering to be used in different frequency bands without extensive redesign. This renders examples of the present disclosure adaptable to a number of different applications, which provides enhanced diversity with minimal increases in production cost. As explained above, the VCO 102 and the delay network 104 have the effect of providing a frequency-divided output; that is, the VCO 102 operates at M times the desired fundamental frequency, and the delay network 104 includes M stages to divide the VCO 102 frequency down.

FIG. 4a shows an implementation in which the delay network 104 is fixed in number of stages (i.e., provides a fixed frequency division to the signal received from the VCO 102). However, the VCO 102 is configured to be widely tunable to cover a large range of frequencies, and thus the overall system may be utilized in a variety of frequency bands.

Conversely, FIG. 4b shows an implementation in which the VCO 102 is fixed to provide a specific center frequency. However, the delay network 104 is configured such that the number of delay stages may be varied by enabling or disabling certain stages that create multiple phases. For example, an odd integer (2x+1) of stages in the delay network 104 by connecting 2x+1 equal delay elements can be programmed to 2x−1 by shorting out two of the stages in the delay network 104. This results in a different frequency division of the VCO 102 signal, and thus enables operation in a different frequency band. That is, certain of the stages in the delay network structure 104 may be enabled and some maybe bypassed to achieve a broad range of division ratios, where the ratios are integer numbers.

FIG. 4c shows yet another alternate implementation. As shown in FIG. 4c, the VCO 102 signal is passed to the delay network 104. However, a second delay network 404 is also implemented, and receives the VCO 102 signal. The number of stages in the second delay network 404 is not the same as the number of stages in the first delay network 104, and thus the second delay network 404 provides a different frequency division than the first delay network 104. As a result, depending on the selected signal path, transmission in multiple frequency bands may be achieved. It is also noted that a second DAC network 408 receives the signals from the second delay network 404, since a different number of DAC network 408 stages (having different weighting or scaling factors) are needed to handle the different number of phase-shifted outputs from the second delay network 104. The outputs of the first and second DAC networks 108, 408 are combined in the same matching network 110; however, only one of the chains is active at a time. For example, an unused chain may be disabled to save power when not in use. The input of each delay network 104, 404 may be coupled to the VCO 102 to reduce or eliminate signal loss, while the outputs of the delay networks 104, 404 may be selectable, for example using multiplexers operating at lower frequencies to reduce phase imbalance.

Figure 5:
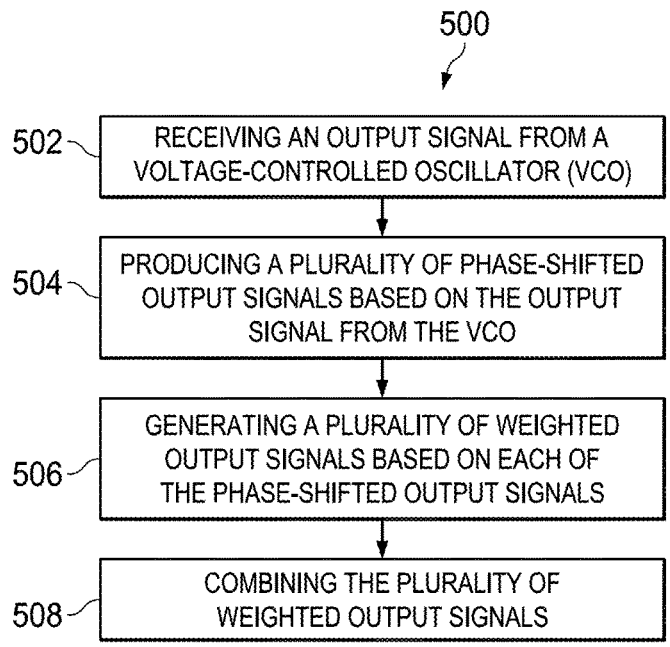
FIG. 5 shows a flow chart of a method for generating an amplified output signal for wireless transmission in accordance with various examples.

FIG. 5 shows a flow chart of a method 500 in accordance with examples of the present disclosure. The method 500 starts in block 502 with receiving an output signal from a voltage-controlled oscillator (VCO).

The method 500 continues in block 504 with producing a plurality of phase-shifted output signals based on the output signal from the VCO. For example, the VCO output may be provided to a multi-stage delay network, which includes multiple delay elements (or stages), such as inverters. Each of the delay elements outputs a phase-shifted VCO signal relative to the VCO signal received by the particular delay element.

The method 500 then continues in block 506 with generating a plurality of weighted output signals based on each of the phase-shifted output signals. For example, a digital-to-analog conversion (DAC) network that operates as the power amplifier for a wireless transceiver may include a number of DAC element stages that corresponds to the number of stages of the delay network. Each stage of the DAC network applies a variable weighting factor to the received phase-shifted VCO signal, for example by tailoring the drive strength of each DAC stage to apply that stage's determined weighting factor. The selection of the weighting or scaling factors is dependent on the particular stage as explained above. In particular, the weighting factors are selected such that harmonics are cancelled at the output of the DAC stages when combined (for example as in block 508, explained below). The combination of weighted output signals from the DAC stages results in an output signal with a near-sinusoidal waveform shape which is then transmitted wirelessly. It should be appreciated that "near-sinusoidal" as used herein refers to a waveform that generally follows a sinusoidal form, but does not necessarily have a perfect sinusoidal shape, which is of course difficult to achieve in practice.

The method 500 concludes in block 508 with combining the plurality of weighted output signals. The DAC network may be used to sum or combine the weighted output signals of the DAC stages. In some embodiments, the method 500 includes providing the combined output signal to a matching network for subsequent wireless transmission.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
    a voltage-controlled oscillator (VCO) configured to generate an output signal based on an input voltage;
    a multi-stage delay network configured to receive the output signal from the VCO, wherein each stage produces a phase-shifted output signal;
    a multi-stage digital-to-analog converter (DAC) network, wherein each stage of the DAC network is associated with a corresponding stage of the delay network, each stage of the DAC network is configured for a weighting factor and is configured to:
        receive the phase-shifted output signal from its corresponding stage of the delay network; and
        generate a weighted output signal based on the received phase-shifted output signal,
        wherein the DAC network is configured to combine the weighted output signal of each stage.

2. The system of claim 1 wherein the weighting factor of each stage of the DAC network is applied such that the resultant combination of weighted output signals is near-sinusoidal.

3. The system of claim 2 wherein each stage of the DAC network comprises a drive strength that is associated with the weighting factor of that stage.

4. The system of claim 1 further comprising a buffer network configured to isolate each stage of the DAC network from each stage of the delay network.

5. The system of claim 1 further comprising a matching network to receive the combination of weighted output signals and perform an impedance transformation prior to providing the combination of weighted output signals to an antenna.

6. The system of claim 5 wherein the delay network comprises a first delay network and the DAC network comprises a first DAC network, the system further comprising:
    a second multi-stage delay network configured to receive the output signal from the VCO, wherein each stage of the second delay network produces a phase-shifted output signal and wherein a number of stages is different in each delay network; and
    a second multi-stage DAC network, wherein each stage of the second DAC network is associated with a corresponding stage of the second delay network, each stage of the second DAC network configured to:
        receive the phase-shifted output signal from its corresponding stage of the second delay network; and
        generate a weighted output signal based on the received phase-shifted output signal,
    wherein the second DAC network is configured to combine the weighted output signal of each stage; and
    wherein the matching network receives the combination of weighted output signals from the first DAC network and the second DAC network and only one of the delay and associated DAC networks is active at a time.

7. The system of claim 1 wherein the VCO output signal comprises a fully differential signal.

8. The system of claim 1 wherein the VCO comprises a ring oscillator and the multi-stage delay network comprises stages of the ring oscillator.

9. The system of claim 1 wherein the delay network comprises m stages and the VCO operates at m times a fundamental frequency.

10. The system of claim 1 wherein a fundamental frequency of the VCO is tunable and the number of stages in the delay network is fixed.

11. The system of claim 1 wherein a fundamental frequency of the VCO is fixed and the number of stages in the delay network is tunable.

12. The system of claim 1 wherein the multi-stage delay network is a first multi-stage delay network, the system further comprising a second multi-stage delay network having a number of stages that is different than the first multi-stage delay network, wherein the output signal of the VCO having a fundamental frequency is provided to the first and second multi-stage delay networks in parallel.

13. A method, comprising:
    receiving an output signal from a voltage-controlled oscillator (VCO);

producing a plurality of phase-shifted output signals based on the output signal from the VCO;

buffering, using a buffer network, the produced phase-shifted output signals;

generating a plurality of weighted output signals based on each of the phase-shifted output signals from the buffer network; and combining the plurality of weighted output signals.

14. The method of claim 13 wherein the weighting factor applied to each of the phase-shifted output signals is applied such that the resultant combination of the weighted output signals is near-sinusoidal.

15. The method of claim 13 wherein the VCO output signal comprises a fully differential signal.

16. The method of claim 13 wherein the VCO comprises a ring oscillator and the method comprises tapping stages of the ring oscillator to produce the plurality of phase-shifted output signals.

17. The method of claim 13 further comprising tuning a fundamental frequency of the VCO.

18. The method of claim 13 wherein a fundamental frequency of the VCO is fixed, the method further comprising tuning a number of stages in a delay network to produce producing the plurality of phase-shifted output signals.

19. The method of claim 13 further comprising receiving the combination of weighted output signals and performing an impedance transformation prior to providing the combination of weighted output signals to an antenna.

* * * * *